(12) United States Patent
Lee et al.

(10) Patent No.: US 6,339,009 B1
(45) Date of Patent: Jan. 15, 2002

(54) METHOD OF MANUFACTURING CAPACITOR OF SEMICONDUCTOR DEVICE

(75) Inventors: Kee Jeung Lee, Seoul; Dong Jun Kim, Kyoungki-do, both of (KR)

(73) Assignee: Hyundai Electronics Industrial Co., Ltd., Kyoungki-do (KR)

( * ) Notice: Subject to any disclaimer, the term of this patent is extended or adjusted under 35 U.S.C. 154(b) by 0 days.

(21) Appl. No.: 09/708,456

(22) Filed: Nov. 9, 2000

(30) Foreign Application Priority Data

Nov. 9, 1999 (KR) .......................................... 99-49502

(51) Int. Cl.$^7$ .............................................. H01L 21/20
(52) U.S. Cl. ........................ 438/396; 438/240; 438/253
(58) Field of Search ............................ 438/3, 240, 253, 438/396, 778, 785

(56) References Cited

U.S. PATENT DOCUMENTS 6,180,542 B1 * 1/2001 Hwang ........................ 438/785
6,204,203 B1 * 3/2001 Narwankar et al. ......... 438/785

FOREIGN PATENT DOCUMENTS

EP 0749134 A1 * 12/1996

OTHER PUBLICATIONS

Nielsen et al., "Composite and Multilayered TaOx–TiOy High Dielectric Constant Thin Films", IEEE vol. 21, No. 3, pp. 274–280, Aug. 1998.*

Chen et al., "A Study of Rapid Photothermal Annealing on the Electrical Properties and Reliability of Tantalum Pentoxide", IEEE vol. 46, No. 4, pp. 814–816, Apr. 1999.*

Kwon et al., "Ta2O5/TiO2 Composite Films for High Density DRAM Capacitors", VLSI Technology, 1993. Digest of Technical Papers. 1993 Symposium on, pp. 45–46.*

Sun et al., "A Novel Approach for Leakage Current Reduction of LPCVD Ta2O5 and TiO2 Films by Rapid Thermal Annealing", Electron Devices Meeting, 1994, Technical Digest., International, 1994, pp. 333–336.*

* cited by examiner

Primary Examiner—Tuan H. Nguyen
(74) Attorney, Agent, or Firm—Pillsbury Winthrop LLP

(57) ABSTRACT

The present invention discloses a method of manufacturing a capacitor of high capacitance using a $(Ta_2O_5)_{1-x}(TiO_2)_x$ thin film as dielectric layer. The method according to the present invention, comprising providing a semiconductor substrate over which selected lower patterns are formed and an intermediate insulating layer is covered; forming a lower electrode on the intermediate insulating layer; depositing a $(Ta_2O_5)_{1-x}$—$(TiO_2)_x$ thin film in an amorphous state on the lower electrode; annealing the amorphous $(Ta_2O_5)_{1-x}$—$(TiO_2)_x$ thin film at a low temperature; annealing the low temperature amorphous $(Ta_2O_5)_{1-x}$—$(TiO_2)_x$ thin film at a high temperature to form a crystalline $(Ta_2O_5)_{1-x}$—$(TiO_2)_x$ thin film as a dielectric layer; and forming an upper electrode on the $(Ta_2O_5)_{1-x}$—$(TiO_2)_x$ thin film.

20 Claims, 2 Drawing Sheets

METHOD OF MANUFACTURING CAPACITOR OF SEMICONDUCTOR DEVICE

BACKGROUND OF THE INVENTION

1. Field of the Invention

The present invention relates to a method of manufacturing a capacitor of a semiconductor device, and more particularly to a method of manufacturing a capacitor having high capacitance using a $(Ta_2O_5)_{1-x}$—$(TiO_2)_x$ thin film as the dielectric layer.

2. Description of the Related Art

It is well known that a capacitor may function as a storage device for storing data in a memory device such as a DRAM (Dynamic Random Access Memory). Such a capacitor typically has a dielectric layer which is interposed between a lower electrode and an upper electrode. The capacitance of the resulting capacitor is proportional to the surface area of the electrode and the dielectric constant of the dielectric layer and is inversely proportional to the spacing between the electrodes, i.e., the thickness of the dielectric layer. Consequently, the capacitance of the capacitor may be increased by increasing the surface area of the electrode, using the dielectric layer having a higher dielectric constant, and/or decreasing the thickness of the dielectric layer.

However, there is a limit to decreasing the thickness of the dielectric layer without inducing unacceptable numbers of dielectric failures. And, methods of increasing the surface area of the electrode tend to complicate the manufacture process of the lower electrode or have detrimental effects on the stability of subsequent processes. Therefore, the current efforts to manufacture capacitors having high capacitance are mainly focused on methods of developing a dielectric layer having a high dielectric constant.

As an example, a conventional capacitor uses a NO thin film having a nitride/oxide structure as a dielectric layer. Because the dielectric constant ϵ of the NO thin film is typically about 4~5, it is difficult to manufacture a capacitor having sufficiently high capacitance using a NO thin film without making other compromises. Therefore, a $Ta_2O_5$ thin film was considered as an alternate dielectric layer material instead of the NO thin film. A $Ta_2O_5$ thin film has a substantially higher dielectric constant, typically about 25~27. Therefore, a capacitor using a $Ta_2O_5$ thin film as a dielectric layer can easily be applied to the next generation DRAM products of more than 256M which require high capacitance of more than 25 fF/cell. The process according to the present invention also has the added advantage of suppressing the generation of soft errors while reducing the refresh time.

However, it is difficult to use the $Ta_2O_5$ thin film as a dielectric layer for of several reasons. First, the $Ta_2O_5$ thin film has unstable stoichiometry, an exchangeable Ta atom in an oxygen vacancy state allows some leakage current to be generated in in the film. Accordingly, after depositing the $Ta_2O_5$ thin film, both a rapid thermal process and a multi-step low temperature oxidizing process for removing the oxygen vacancy are typically performed, thereby complicating the formation of the $Ta_2O_5$ thin film.

Second, the $Ta_2O_5$ thin film has a high oxidation reaction to both polysilicon and TiN, two materials commonly used to form the lower electrode and an upper electrode. As a result, oxygen from the $Ta_2O_5$ film tends to react with the electrodes during subsequent thermal processes, thereby forming a low dielectric oxide layer on each interface. Accordingly, the electrical characteristics of a $Ta_2O_5$ capacitor are degraded as a result of the formation of these the low dielectric oxide layers.

Third, organic matter from the tantalum (V) ethoxide $Ta(OC_2H_5)_5$, a precursor of $Ta_2O_5$, reacts with $O_2$ or $N_2O$ gas, carbon, carbon compounds such as $CH_4$ and $C_2H$, and moisture($H_2O$) which are incorporated into and exist as impurities in the $Ta_2O_5$ thin film. The presence of these impurities increases the leakage current and degrades the capacitor's dielectric characteristics.

SUMMARY OF THE INVENTION

Accordingly, it is the object of the present invention to provide a method of manufacturing a capacitor for a semiconductor device capable of solving the problems caused by the oxygen vacancies and impurities to obtain high capacitance and low leakage by utilizing a $(Ta_2O_5)_{1-x}$-$(TiO_2)_x$ thin film as a dielectric layer.

To accomplish the aforementioned object, a method of manufacturing a capacitor of a semiconductor device according to the present invention comprises the steps of: providing a semiconductor substrate over which selected lower patterns are formed and an intermediate insulating layer is covered; forming a lower electrode on the intermediate insulating layer; depositing a $(Ta_2O_5)_{1-x}$—$(TiO_2)$ thin film in an amorphous state on the lower electrode; annealing the amorphous $(Ta_2O_5)_{1-x}$—$(TiO_2)_x$ thin film at a low temperature; annealing the low temperature annealed amorphous $(Ta_2O_5)_{1-x}$—$(TiO_2)_x$ thin film at a high temperature so as to form a crystalline $(Ta_2O_5)_{1-x}$-$(TiO_2)_x$ thin film as a dielectric layer; and forming an upper electrode on the $(Ta_2O_5)_{1-x}$—$(TiO_2)_x$ thin film.

BRIEF DESCRIPTION OF THE DRAWINGS

The objects and advantages of the present invention can be further understood with reference to the following detailed description and the attached drawings.

DETAILED DESCRIPTION OF THE INVENTION

A method of manufacturing a capacitor of a semiconductor device is described with reference to FIGS. 1A to 1D.

Figure 1A:
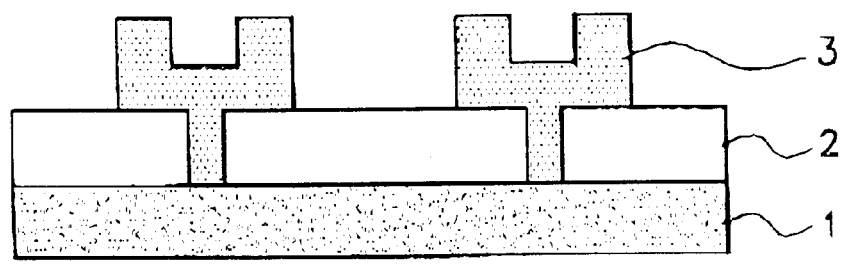
FIGS. 1A to 1D are cross-sectional views describing a method of manufacturing a capacitor of a semiconductor device.

In FIG. 1A, lower patterns (not shown) with basic structures such as transistors and resistors are formed in a semiconductor substrate 1. An intermediate insulating layer 2 is formed on the semiconductor substrate 1 to cover the lower pattern. A lower electrode 3, typically a doped polysilicon layer, is formed on the intermediate insulating layer 2 by a known process., The lower electrode 3 also contacts a selected portion of the substrate 1. The lower electrode 3 may be configured to provide a 3-dimensional structure such as a cylinder structure or a Hemi Spherical Grain (HSG) surface.

Figure 1B:
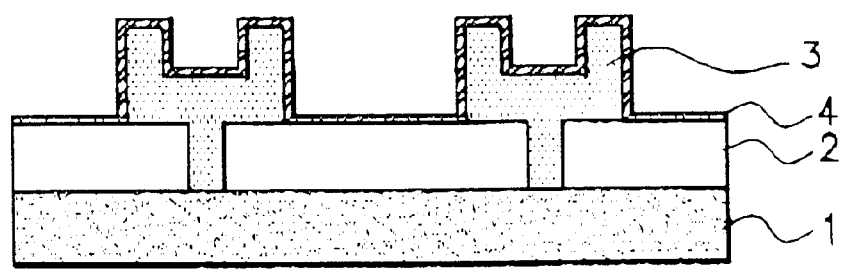

As shown in FIG. 1B, the surface of the lower electrode 3 is nitrified, thereby forming a nitride layer 4 on the surface of the lower electrode 3 and the intermediate insulating layer 2. The nitrifying process is performed to prevent oxidation at the interface between the lower electrode 3 and the $(Ta_2O_5)_{1-x}$—$(TiO_2)_x$ thin film during either the formation of the $(Ta_2O_5)_{1-x}$—$(TiO_2)_x$ thin film or during a subsequent thermal process.

Herein, the nitrifying process is preferably performed by discharging plasma in an LPCVD (Low Pressure Chemical Vapor Deposition) chamber having a $NH_3$ gas or a mixed $N_2/H_2$ gas atmosphere. At this time, the substrate 1 is required to remain at 300~500° C. Alternatively, the nitrifying process may be performed by annealing at 650~950° C. under a $NH_3$ gas atmosphere using a RTP Rapid Thermal Process). In addition, the nitrifying process may also be performed by annealing at 500~1,000° C. under a $NH_3$ gas atmosphere using a furnace.

Before the nitrifying process, a cleaning process using HF gas or HF solution can be performed on the surface of the lower electrode 3. The cleaning process using HF is performed to improve the capacitor characteristics, thereby removing any natural silicon oxide ($SiO_2$) which is present on the surface of the lower electrode (3). A cleaning process using $NH_4OH$ solution or $H_2SO_4$ solution can also be performed before and after the HF cleaning process to improve the uniformity of the lower electrode 3.

After the nitrifying process, a brief oxidizing process can be performed. The brief oxidizing process is performed to more effectively restrain excess oxidation from generating at the interface between the lower electrode 3 and the $(Ta_2O_5)_{1-x}$—$(TiO_2)_x$ thin film. This oxidation may be accomplished by annealing under a $NO_2$ gas or $O_2$ gas atmosphere.

Figure 1C:
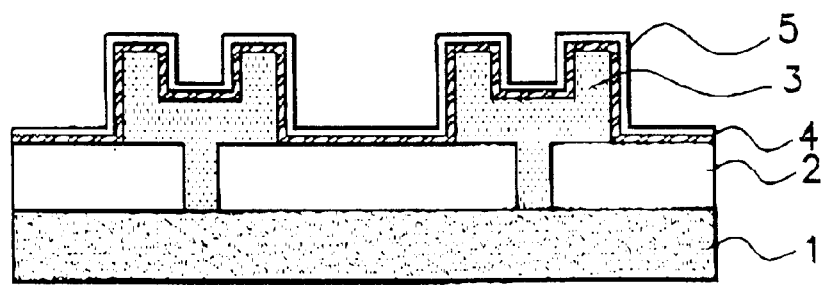

FIG. 1C shows a $(Ta_2O_5)_{1-x}$—$(TiO_2)_x$ thin film 5 that has been deposited in an amorphous state on the lower electrode 3 and the nitride layer 4 formed on the surface thereof. The amorphous $(Ta_2O_5)_{1-x}$—$(TiO_2)_x$ thin film is then annealed at a low temperature. The amorphous $(Ta_2O_5)_{1-x}$—$(TiO_2)_x$ thin film is then annealed again at a higher temperature to form a crystalline $(Ta_2O_5)_{1-x}$—$(TiO_2)_x$ thin film 5 that will act as a dielectric layer.

The amorphous $(Ta_2O_5)_{1-x}$—$(TiO_2)_x$ thin film is deposited using a LPCVD process. This result is achieved by supplying a predetermined amount of Ta compound vapor gas, Ti compound vapor gas and reaction gas $O_2$ into an LPCVD chamber at 300~600° C. at less than 10 torr pressure using a flow controller such as Mass Flow Controller (MFC). Under these conditions, a surface chemical reaction of the gases on the surface of the lower electrode 3 forms the $(Ta_2O_5)_{1-x}$—$(TiO_2)_x$ layer. The mole ratio (of the metals Ti and Ta?) in the $(Ta_2O_5)_{1-x}$—$(TiO_2)_x$ thin film is preferably Ti/Ta=0.01~1.0 with the value of x being less than 0.5. The Ta compound vapor gas is preferably made by supplying a tantalum (V) ethoxide, $Ta(OC_2H_5)_5$, solution into an evaporator or an evaporation tube at 140~200° C. in a predetermined amount using a flow controller such as MFC and then evaporating the supplied $Ta(OC_2H_5)_5$ solution. The Ti compound vapor gas is preferably made by supplying titanium isopropylate $Ti[OCH(CH_3)_2]_4$ solution into an evaporator or an evaporation tube at 200~300° C. in a predetermined amount using a flow controller such as MFC and then evaporating the supplied titanium isopropylate $Ti[OCH(CH_3)_2]_4$ solution. Compounds such as titanium tetrachloride, $TiCl_4$; TDMAT, (tetrakisdimethylamino) titanium; or TDEAT, (tetrakisdiethylamino) titanium; can be used as a precursor for obtaining the Ti compound vapor gas.

The low temperature annealing process for the amorphous $(Ta_2O_5)_{1-x}$—$(TiO_2)_x$ thin film is performed at 300~500° C. using an ultraviolet/ozone, UV—$O_3$, process. The high temperature annealing process for the low temperature annealed $(Ta_2O_5)_{1-x}$—$(TiO_2)_x$ thin film is performed in a $N_2O$, $O_2$ or $N_2$ gas atmosphere at 650~950° C. using a furnace or a rapid thermal process.

As a result of the low and high temperature annealing processes, oxygen vacancies and carbon compounds in the $(Ta_2O_5)_{1-x}$—$(TiO_2)_x$ thin film are removed and the densification of the $(Ta_2O_5)_{1-x}$—$(TiO_2)_x$ thin film is obtained by inducing crystallization.

The $(Ta_2O_5)_{1-x}$—$(TiO_2)_x$ thin film, much like the prior art $Ta_2O_5$ thin film, incorporates oxygen vacancies and carbon compounds such as $CH_4$, $C_2H_6$ and unbound carbon when deposited in the amorphous state. The number of oxygen vacancies in the $(Ta_2O_5)_{1-x}$—$(TiO_2)_x$ thin film depends on the content of and binding state of $TiO_2$, which is, however, typically smaller than the number of oxygen vacancies in the $Ta_2O_5$ thin film.

When a low temperature annealing is performed on the as-deposited amorphous $(Ta_2O_5)_{1-x}$—$(TiO_2)_x$ thin film, the majority of the incorporated oxygen vacancies are removed, and unbound carbon is oxidized by activated oxygen to form volatile gases such as CO or $CO_2$. When the subsequent high temperature thermal annealing is performed on the low temperature annealed $(Ta_2O_5)_{1-x}$—$(TiO_2)_x$ thin film, the volatile carbon compounds such as the CO, $CO_2$, $CH_4$, and $C_2H_4$ are removed and the $(Ta_2O_5)_{1-x}$—$(TiO_2)_x$ thin film is simultaneously densified to form a crystalline $(Ta_2O_5)_{1-x}$—$(TiO_2)_x$ thin film. Consequently, the $(Ta_2O_5)_{1-x}$—$(TiO_2)_x$ thin film (5) formed according to the present invention has dielectric characteristics.

The $(Ta_2O_5)_{1-x}$—$(TiO_2)_x$ thin film (5) of the present invention is deposited in the amorphous state and undergoes the low and high temperature annealing processes in sequence, thereby producing a structure where $TiO_2$ (å=40) in combination with $Ta_2O_5$ has a tetragonal lattice structure. Such a combination structure is more stable than a combination structure of the $Ta_2O_5$ thin film itself. A capacitor constructed according to the present invention with the $(Ta_2O_5)_{1-x}$—$(TiO_2)_x$ thin film will exhibit improved electrical characteristics.

Figure 1D:
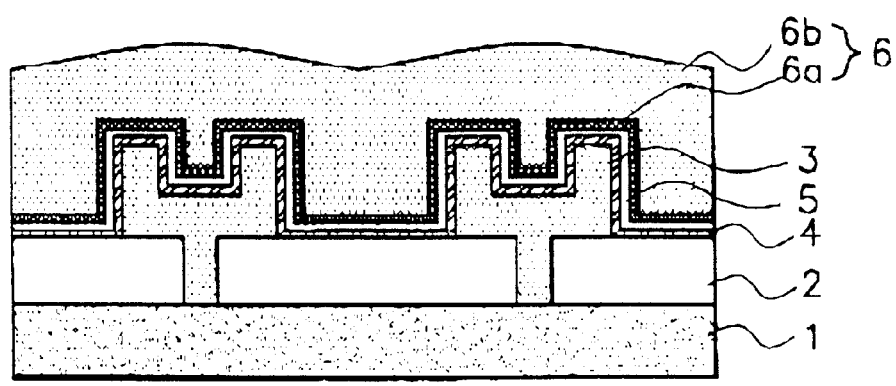

In FIG. 1D, an upper electrode 6 is formed on the $(Ta_2O_5)_{1-x}$—$(TiO_2)_x$ thin film 5, thereby completing a capacitor according to the present invention. The upper electrode 6 is made from a stack structure of a metal layer 6a and a buffer 6b. The upper electrode 6 may be made of only the metal layer 6a. Herein, the metal layer 6a is TiN, TaN, W, WSi, Ru, $RuO_2$, Ir, $IrO_2$ or Pt, preferably TiN, and the buffer layer 6b is preferably a doped polysilicon layer.

The capacitor of the present invention, manufactured according to the aforementioned process produces a $(Ta_2O_5)_{1-x}$—$(TiO_2)_x$ thin film having relatively higher dielectric constant ($\epsilon$=50) than the known NO, ONO and $Ta_2O_5$ thin films when used as a dielectric layer, thereby permitting increased capacitance without compromising other characteristics. Therefore, the capacitor of the present invention, using the $(Ta_2O_5)_{1-x}$—$(TiO_2)_x$ thin film as the dielectric layer can be profitably applied to next generation of DRAM product of more than 256M, that will require high capacitance of more than 25 fF/cell.

Furthermore, since the $(Ta_2O_5)_{1-x}$—$(TiO_2)_x$ thin film is structurally stable, the capacitor of the present invention is strong enough to resist an electrical discharge applied from outside. Therefore, the capacitor of the present invention has an improved electrical characteristic with respect to electrostatic discharge (ESD) sensitivity.

Moreover, since the dielectric constant of the $(Ta_2O_5)_{1-x}$—$(TiO_2)_x$ thin film is higher than that of the prior art ONO, NO or $Ta_2O_5$ thin films, a capacitor with sufficiently high capacitance can be manufactured even though the lower electrode comprises only a simple stack structure. Consequently, the process of manufacturing the capacitor, i.e., the process of forming the lower electrode, can be simplified, thereby providing the added advantages of reduced cost and increased productivity.

Various other modifications will be apparent to, and can be readily made by, those skilled in the art without departing from the scope and spirit of the present invention.

What is claimed is:

1. A method of manufacturing a capacitor of a semiconductor device, comprising:
   providing a semiconductor substrate over which selected lower patterns are formed and an intermediate insulating layer is covered;
   forming a lower electrode on the intermediate insulating layer;
   depositing a $(Ta_2O_5)_{1-x}$—$(TiO_2)_x$ thin film in an amorphous state on the lower electrode;
   annealing the amorphous $(Ta_2O_5)_{1-x}$—$(TiO_2)_x$ thin film at a low temperature;
   annealing the low temperature amorphous $(Ta_2O_5)_{1-x}$—$(TiO_2)_x$ thin film at a high temperature so as to form a crystalline $(Ta_2O_5)_{1-x}$—$(TiO_2)_x$ thin film as a dielectric layer; and
   forming an upper electrode on the $(Ta_2O_5)_{1-x}$—$(TiO_2)_x$ thin film.

2. The method according to claim 1, wherein the lower electrode is made of a doped polysilicon layer.

3. The method according to claim 1, further comprising a step of nitrifying the surface of the lower electrode between the step of forming the lower electrode and the step of depositing the $(Ta_2O_5)_{1-x}$—$(TiO_2)_x$ thin film.

4. The method according to claim 3, wherein the nitrifying step is performed by discharging plasma in an LPCVD chamber of $NH_3$ gas or $N_2/H_2$ gas in an in-Situ or ex-Situ state.

5. The method according to claim 4, wherein the nitrifying step is performed at the temperature in which the semiconductor substrate is maintained at 300~500° C.

6. The method according to claim 3, wherein the nitrifying step is performed by annealing at 650~950° C. under $NH_3$ gas atmosphere using RTP.

7. The method according to claim 3, further comprising slightly oxidizing under $NO_2$ or $O_2$ gas atmosphere after nitrifying the surface of the lower electrode.

8. The method according to claim 1, wherein the nitrifying step is performed by annealing at 500~1,000° C. under $NH_3$ gas atmosphere using a furnace.

9. The method according to claim 1, further comprising a step of cleaning the surface of the lower electrode using HF vapor or HF solution before the step of nitrifying the surface of the lower electrode.

10. The method according to claim 9, further comprising cleaning the surface of the lower electrode using $NH_4OH$ solution or $H_2SO_4$ solution before and after the cleaning step using HF.

11. The method according to claim 1, wherein depositing the $(Ta_2O_5)_{1-x}$—$(TiO_2)_x$ thin film in the amorphous state is performed by supplying a predetermined amount of Ta compound vapor gas, Ti compound vapor gas and excess reaction gas $O_2$ into an LPCVD chamber of 300~600° C. and less than 10 torr pressure.

12. The method according to claim 11, wherein in the $(Ta_2O_5)_{1-x}$—$(TiO_2)_x$ thin film has a mole ratio of Ti/Ta= 0.01~1.0 or so with X being less than about 0.5.

13. The method according to claim 11, wherein the Ti compound vapor gas is obtained by supplying titanium isopropylate $Ti[OCH(CH_3)_2]_4$ solution into an evaporator or an evaporation tube of 200~300° C.

14. The method according to claim 13, wherein the Ti compound is titanium tetrachloride $TiCl_4$, TDMAT (tetrakisdimethylamino)titanium or TDEAT (tetrakisdiethylamino)titanium or titanium isopropylate $Ti[OCH(CH_3)_2]_4$.

15. The method according to claim 1, wherein the Ta compound vapor gas is obtained by supplying $Ta(OC_2H_5)_5$ solution into an evaporator or an evaporation tube of 140~200° C. in a predetermined amount and evaporating the supplied $Ta(OC_2H_5)_5$ solution.

16. The method according to claim 1, wherein the low temperature annealing is performed at 300~500° C. using UV—$O_3$.

17. The method according to claim 1, wherein the high temperature annealing is performed under $N_2O$ or $O_2$ or $N_2$ gas and at 650~950° C. using a furnace or an RTP (Rapid Thermal Process).

18. The method according to claim 1, wherein the upper electrode is made of TiN, TaN, W, WSi, Ru, $RuO_2$, Ir, $IrO_2$ or Pt.

19. The method according to claim 1, wherein the upper electrode is a stack structure of a metal layer and a buffer layer.

20. The method according to claim 19, wherein the buffer layer is a doped polysilicon layer.

* * * * *